United States Patent
Kagan et al.

(10) Patent No.: US 9,865,465 B2
(45) Date of Patent: Jan. 9, 2018

(54) NANOCRYSTAL THIN FILM FABRICATION METHODS AND APPARATUS

(71) Applicant: THE TRUSTEES OF THE UNIVERSITY OF PENNSYLVANIA, Philadelphia, PA (US)

(72) Inventors: Cherie R. Kagan, Bala Cynwyd, PA (US); David K. Kim, Lincoln, MA (US); Ji-Hyuk Choi, Philadelphia, PA (US); Yuming Lai, Philadelphia, PA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 0 days.

(21) Appl. No.: 14/761,799

(22) PCT Filed: Jan. 17, 2014

(86) PCT No.: PCT/US2014/012023
§ 371 (c)(1),
(2) Date: Jul. 17, 2015

(87) PCT Pub. No.: WO2014/113655
PCT Pub. Date: Jul. 24, 2014

(65) Prior Publication Data
US 2015/0364324 A1    Dec. 17, 2015

Related U.S. Application Data

(60) Provisional application No. 61/754,248, filed on Jan. 18, 2013.

(51) Int. Cl.
*H01L 23/58* (2006.01)
*H01L 21/225* (2006.01)
(Continued)

(52) U.S. Cl.
CPC ............ *H01L 21/225* (2013.01); *B82Y 10/00* (2013.01); *H01L 21/0256* (2013.01); *H01L 21/02422* (2013.01); *H01L 21/02628* (2013.01); *H01L 21/30604* (2013.01); *H01L 29/0665* (2013.01); *H01L 29/36* (2013.01); *H01L 29/66969* (2013.01); *H01L 29/78681* (2013.01); *H01L 29/22* (2013.01)

(58) Field of Classification Search
CPC ..... H04W 84/12; H04W 16/26; H04W 72/04; H04W 84/047; H04W 28/06; H04W 28/22; H04W 4/00; H04W 4/18; H04W 76/025; H04W 88/02; H04W 88/14; H04B 7/15542; H04B 7/1555; H04B 7/15557; H04B 7/2606; H01L 21/02422; H01L 21/0256; H01L 21/02628; H01L 21/225; H01L 21/30604;
(Continued)

(56) References Cited

U.S. PATENT DOCUMENTS 6,268,041 B1 * 7/2001 Goldstein ............. B22F 1/0018
428/206
6,365,969 B1 * 4/2002 Yamaguchi ....... H01L 21/28575
257/744
(Continued)

FOREIGN PATENT DOCUMENTS

EP    2442364    4/2012

OTHER PUBLICATIONS

International Search Report for PCT/US2014/012023 dated Aug. 13, 2014.
(Continued)

*Primary Examiner* — Mohammed Shamsuzzaman
(74) *Attorney, Agent, or Firm* — RatnerPrestia (57) ABSTRACT

Nanocrystal thin film devices and methods for fabricating nanocrystal thin film devices are disclosed. The nanocrystal thin films are diffused with a dopant such as Indium, Potassium, Tin, etc. to reduce surface states. The thin film devices may be exposed to air during a portion of the fabrication. This enables fabrication of nanocrystal-based devices using a wider range of techniques such as photolithography and photolithographic patterning in an air environment.

6 Claims, 9 Drawing Sheets

(51) Int. Cl.
*H01L 21/02* (2006.01)
*H01L 29/06* (2006.01)
*B82Y 10/00* (2011.01)
*H01L 29/66* (2006.01)
*H01L 29/786* (2006.01)
*H01L 21/306* (2006.01)
*H01L 29/36* (2006.01)
*H01L 29/22* (2006.01)

(58) Field of Classification Search
CPC .... H01L 29/0665; H01L 29/22; H01L 29/36; H01L 29/66969; H01L 29/78681; H01R 12/675; H01R 13/5812; H01R 13/633
USPC .................. 257/629, 213; 438/164; 428/403; 427/250; 136/244
See application file for complete search history.

(56) References Cited

U.S. PATENT DOCUMENTS

| | | | |
|---|---|---|---|
| 6,811,957 B1 | 11/2004 | Mau et al. | |
| 9,123,538 B2* | 9/2015 | Wheeler | ........... H01L 21/02612 |
| 2007/0040191 A1* | 2/2007 | Bezryadin | .............. B82Y 10/00 257/213 |
| 2007/0227578 A1* | 10/2007 | Perozziello | ......... H01L 31/0322 136/244 |
| 2008/0044964 A1* | 2/2008 | Kamath | ................ H01L 21/316 438/164 |
| 2010/0025595 A1 | 2/2010 | Bawendi et al. | |
| 2010/0055462 A1* | 3/2010 | Cao | ........................ C09K 11/02 428/403 |
| 2012/0261624 A1 | 10/2012 | Peng et al. | |
| 2014/0050851 A1* | 2/2014 | Kagan | ...................... H01B 1/06 427/250 |
| 2015/0214376 A1* | 7/2015 | Koezuka | ............... G02F 1/1368 257/43 |

OTHER PUBLICATIONS

International Preliminary Report and Written Opinion for PCT/US2014/012023 dated Jul. 30, 2015.
Notice of Allowance and Fee(s) Due for U.S. Appl. No. 13/969,863 dated Jan. 12, 2016.

* cited by examiner

NANOCRYSTAL THIN FILM FABRICATION METHODS AND APPARATUS

CROSS REFERENCE TO RELATED APPLICATIONS

This application is the U.S. National Phase Application of PCT International Application No. PCT/US2014/012023 filed Jan. 17, 2014, which claims priority to U.S. Provisional Patent Application No. 61/754,248 filed Jan. 18, 2013, the contents of such applications being incorporated herein by reference.

STATEMENT REGARDING FEDERALLY SPONSORED RESEARCH

Aspects of this invention were made with government support under one or more of: National Science Foundation MRSEC Program under Award Number DMR-1120901, National Science Foundation CBET Program under Award CBET-0854226, and the U.S. Department of Energy Office of Basic Energy Sciences, Division of Materials Science and Engineering, under Award No. DE-SC0002158. The government has rights in this invention.

FIELD OF THE INVENTION

The present invention relates to the field of electronics and, more particularly, to nanocrystal thin film device fabrication methods and apparatus.

BACKGROUND OF THE INVENTION

Quantum dots (QDs) or nanocrystals (NCs) are of particular interest for their size-tunable and shape-tunable optical, electrical, and magnetic properties as well as their propensity to self-assemble from solution into nanostructured solids. These characteristics make NCs desirable for use in thin film devices such as semiconductor devices.

SUMMARY OF THE INVENTION

Aspects of the present invention are embodied in nanocrystal thin film devices and methods for fabricating nanocrystal thin film devices. The nanocrystal thin films may be diffused with a dopant such as Indium, Potassium, Tin, etc. to reduce surface states. The thin film devices may be exposed to air during a portion of the fabrication. This enables fabrication of nanocrystal-based devices using a wider range of techniques such as photolithography and photolithographic patterning in an air environment.

Additionally, the inventors have recognized that when nanocrystals are assembled into nanocrystal solids, the relatively long, bulky ligands typically used to control the nanocrystal growth prevent strong interparticle coupling desirable for device application. Aspects of the present invention replace the ligands typically found in nanocrystal solids with chalcogenocyanate-based ligands, e.g., for use in thin-film based electronics, optoelectronics, and photonics.

BRIEF DESCRIPTION OF THE DRAWINGS

The invention is best understood from the following detailed description when read in connection with the accompanying drawings, with like elements having the same reference numerals. This emphasizes that according to common practice, the various features of the drawings are not drawn to scale. On the contrary, the dimensions of the various features are arbitrarily expanded or reduced for clarity. Included in the drawings are the following figures.

DETAILED DESCRIPTION OF THE INVENTION

Figure 1:
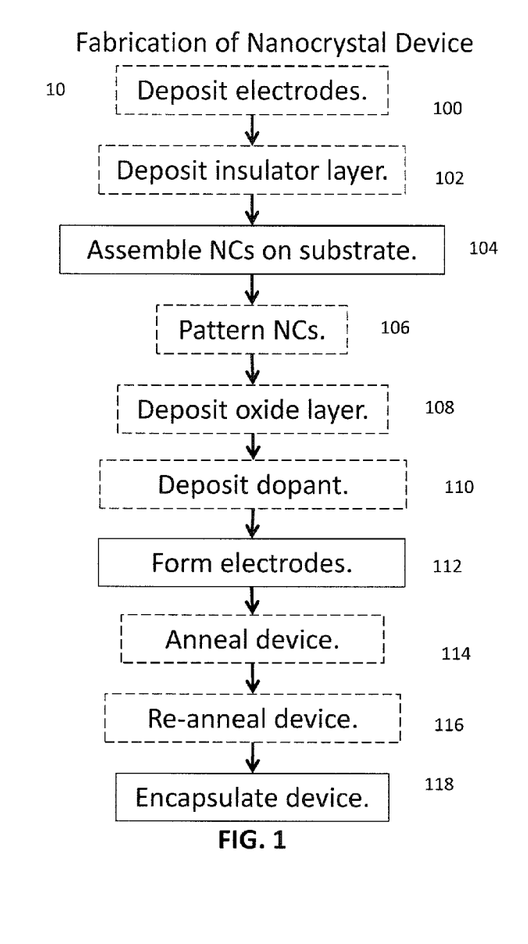
FIG. 1 is a flowchart depicting formation of a nanocrystal thin film device in accordance with aspects of the present invention.

FIG. 1 is a flowchart 10 of exemplary steps for fabricating a nanocrystal thin film device. One or more of the steps depicted in flow chart 10 and other flow charts within this application, and which are described below, may be omitted and/or performed in a different order in order to fabricate a variety of electronic devices. Electronic devices that may benefit from the methods and devices described herein include electronic devices (e.g., field-effect transistors (FETs)), optoelectronic devices (e.g., photodetectors), thermoelectric devices, etc. One or more steps may be performed in an air environment and/or the device may be exposed to air between one or more steps.

At block 100, electrodes are optionally deposited on a substrate prior to deposition of the nanocrystals and, at block 102, an insulator (e.g., an oxide layer, a polymer layer, etc.) is optionally deposited on the substrate. The substrate may be a non-flexible material (e.g., glass, silicon, etc.) or a flexible material (e.g. polyimide) that may, depending on the type of electronic device being formed, be a conductor, semiconductor, or insulator on which nanocrystals may be assembled. In one embodiment, the substrate is a doped semiconductor material such as n+doped silicon, which acts as a metal. The electrodes may be deposited on the substrate and may be Indium (In), Gold (Au), Aluminum (Al), Indium Tin Oxide (ITO), etc. The insulator may be an oxide such as $SiO_2$ or $Al_2O_3$ or a polymer such as parylene or polyimide. Other suitable materials for use as electrodes and an insulator will be understood by one of skill in the art.

At block 104, nanocrystals are assembled on the substrate. The nanocrystals may be cadmium based (e.g., CdS, CdSe, CdTe), zinc based (e.g., ZnS, ZnSe, ZnTe), nickel based (e.g., NiFe), gold based, silver based, bismuth based, lead based (e.g., PbS, PbSe, PbTe). Other suitable nanocrystal compositions, alloys will be understood by one of skill in the art from the description herein. The nanocrystals may be deposited by drop-casting, spin-coating, dip-coating, liquid interface transfer, and/or printing. Assembly of the nanocrystals may involve solid exchange or solution exchange of ligands as described below with reference to FIGS. 8 and 9, respectively. Multiple layers of nanocrystals may optionally be deposited to fill void spaces in the nanocrystal film due to shrinkage resulting from ligand exchange, increase the film thickness, and/or tailor the composition. In an embodiment where the device being fabricated is a FET, the number of layers deposited may be minimal, (e.g. less than four) as a thinner NC layer may be desirable for FET functionality. In alternative embodiments, a thicker NC layer is desirable where the device fabricated is used, for example, as a photodetector or in solar cell applications.

Figure 7A:
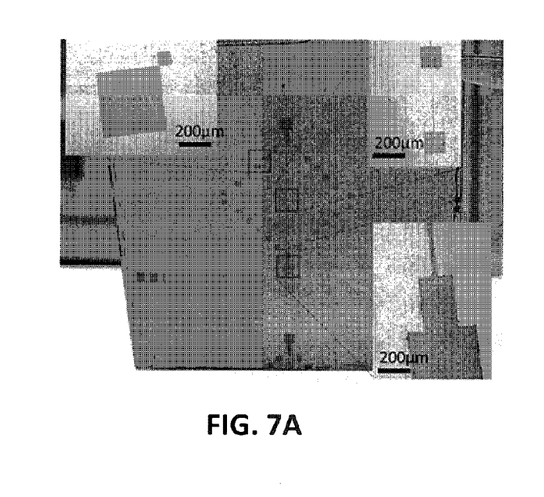
FIG. 7A is an image of a photograph of a photo-lithographically patterned nanocrystal thin film layer with three higher resolution optical micrographs inset in accordance with an aspect of the present invention.
Figure 7B:
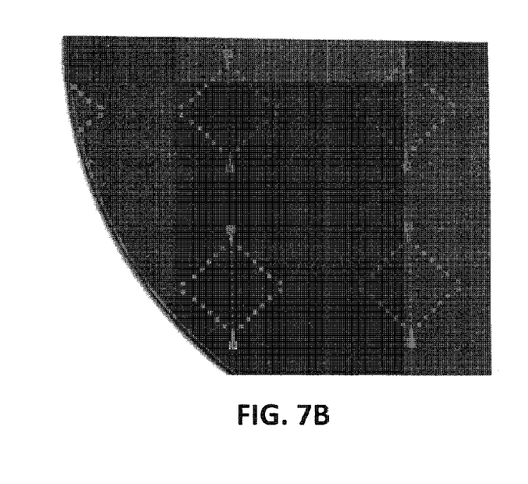
FIG. 7B is an image of a photograph of a wafer on which nanocrystal thin film devices are patterned in accordance with an aspect of the present invention.

At block 106, the nanocrystals are optionally patterned. In one embodiment, photolithography is used to pattern the nanocrystals. Patterning may be used to reduce cross-talk between electronic devices (such as FETs) and lower device OFF currents formed using CdSe nanocrystal solids, for example. After depositing the nanocrystal thin film (e.g., by spin-coating, drop-casting, liquid interface transfer, etc.), photoresist may be spin-cast and photopatterned. A wet etchant such as tetramethylammonium hydroxide (TMAH) may be used as a solvent to delaminate thiocyanate-exchanged nanocrystal thin films. Desired active nanocrystal solid areas are protected by a film of photoresist. For a positive photoresist, photoexposed regions of photoresist and the underlying nanocrystal solid is lifted-off, leaving behind well-patterned active areas, as shown in the insets for thiocyanate-exchanged CdSe nanocrystal thin films in FIG. 7A. In an alternative embodiment, for a negative photoresist, photoexposed regions of photoresist would remain to protect the underlying nanocrystal layer, and unexposed regions of photoresist and the underlying naoncrystal solid is removed. Photopatterning to 5 µm line width resolution or greater may be achieved (FIG. 7A, upper right inset image) of the features on the parent photomask. FIG. 7B depicts a wafer on which nanocrystal thin film devices are patterned in accordance with an aspect of the present invention. Patterning of the nanocrystals is described in further detail below with reference to FIG. 2.

At block 108, an oxide layer is optionally deposited over the nanocrystal layer, e.g., to prevent delamination during subsequent processing (such as using etchants during photolithography to define electrodes). The oxide layer may be porous to permit electrical connection between the assembled nanocrystals and electrodes (which may be patterned using photolithography) that are deposited on the oxide layer.

At block 110, a layer of dopant is optionally deposited over the nanocrystal layer to reduce surface states (e.g., surface states created during ligand exchange, upon exposure to air, etc.). In one embodiment, a layer of dopant is deposited prior to the formation of the electrodes (block 112). In another embodiment, a layer of dopant is deposited after the formation of electrodes (block 112). The layer of dopant may be deposited such that it is thicker near the regions where the electrodes are deposited. In one embodiment, doping material is present in the deposited electrodes (block 112) and the separate depositing of a layer of dopant may also be performed or may be omitted. The dopant may be a material such as Indium, Potassium, Tin.

At block 112, electrodes are formed over the nanocrystal layer. The electrodes may be Au, In, and/or other conductive material suitable for use as an electrode. In one embodiment, electrodes are pre-patterned prior to deposition of the nanocrystals. The pre-patterned electrodes may be In, as In diffuses at mild temperatures. The pre-patterned electrodes may be Au. In a particular embodiment, the pre-patterned electrodes may be Au formed on top of In. Alternatively, the pre-patterned electrodes may be In formed on top of Au.

In one embodiment, In/Au electrodes are deposited by thermal evaporation in a vacuum chamber using a shadow mask. In a particular embodiment, Au electrodes are deposited over In electrodes. The In/Au electrodes may be evaporated at a rate of about 0.1 Å/s to about 0.5 Å/s. In a particular embodiment, the In/Au electrodes are evaporated at a rate of about 0.3 Å/s. Other suitable materials and deposition techniques will be understood by one of skill in the art from the description herein. At block 114, the device may be optionally annealed (e.g., depending on the type of dopant). The device may be annealed for about 10 minutes. The device may be annealed at temperatures ranging from about 77 C to about 300 C. In a particular embodiment, the device is annealed at temperatures ranging from about 200 C to about 250 C. In an exemplary embodiment, the device is annealed at about 250 C. At block 116, the device is optionally re-annealed, e.g., in substantially the same manner as the device was initially annealed, after the device is exposed to air, solvents, and/or oxygen (O2). Re-annealing of the device using available fabrication technologies that will be understood by those of skill in the art from the description herein (e.g., In diffusion) substantially reverses the degradation of the device that results from exposure to air, water, solvents, and/or O2, thereby repairing/recovering the device.

At block 118, the device is encapsulated in an insulator. The device may be encapsulated in an insulator such as an oxide (e.g., Al2O3) or a polymer (e.g., parylene) or a combination of materials. The inventors have discovered that once the device is encapsulated, the electrical properties tend to remain stable and eliminate the need to re-anneal the device in order to restore electrical properties.

Additionally, since the encapsulation at block 118 may be performed at similar temperatures as the re-annealing at block 116, the re-annealing and the encapsulating may be performed simultaneously (e.g., in one step).

Figure 2:
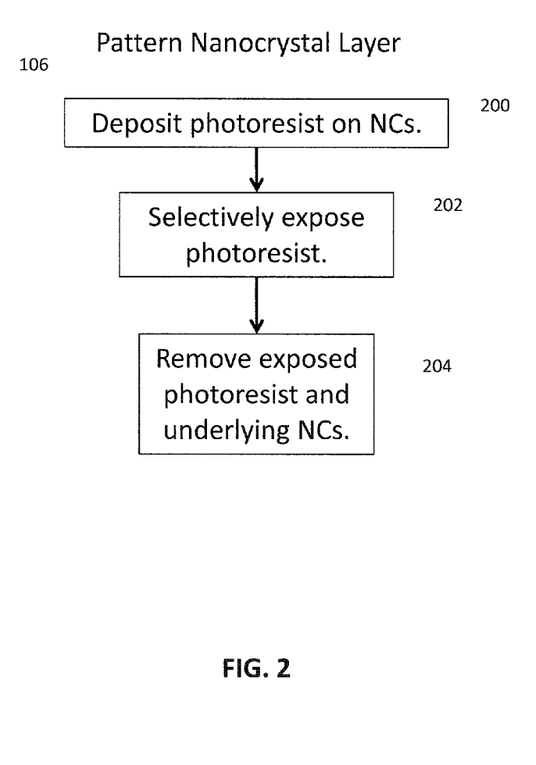
FIG. 2 is a flowchart depicting patterning of a nanocrystal thin film in accordance with aspects of the present invention.

FIG. 2 is a flow chart for use in describing the patterning of nanocrystals (block 106 of FIG. 1). In one embodiment, one or more steps of the flowchart depicted in FIG. 2 and described below may be performed in an air environment.

At block 200, photoresist is deposited on the nanocrystals. For example, a positive photoresist, MICROPOSIT S1813, may be deposited by spin coating to form a uniform film of thickness ~1.3 μm on top of the nanocrystal layer.

At block 202, the deposited photoresist is selectively exposed. The photoresist may be exposed by exposure to light. The exposure may be performed on a standard photolithography tool, for example a mask aligner. In the case of the photoresist MICROPOSIT S1813, the required exposure energy density is in the range of 60 to 215 mJ/cm2, under 405 nm illumination.

At block 204, the exposed photoresist and the underlying nanocrystals are removed. After exposure, the samples may be immersed in a solvent such as tetramethylammonium hydroxide (TMAH), for a time of 20 to 50 sec, depending on the exposure energy density, removing the exposed photoresist. The underlying nanocrystals are removed by TMAH by immersion for an additional 1 to 2 min. The unexposed regions of the resist and nanocrystals are not removed by TMAH and remain on the substrate surface. The unexposed regions of the photoresist may later be removed from the nanocrystal layer by immersion in acetone for 2 to 4 min.

Figure 3:
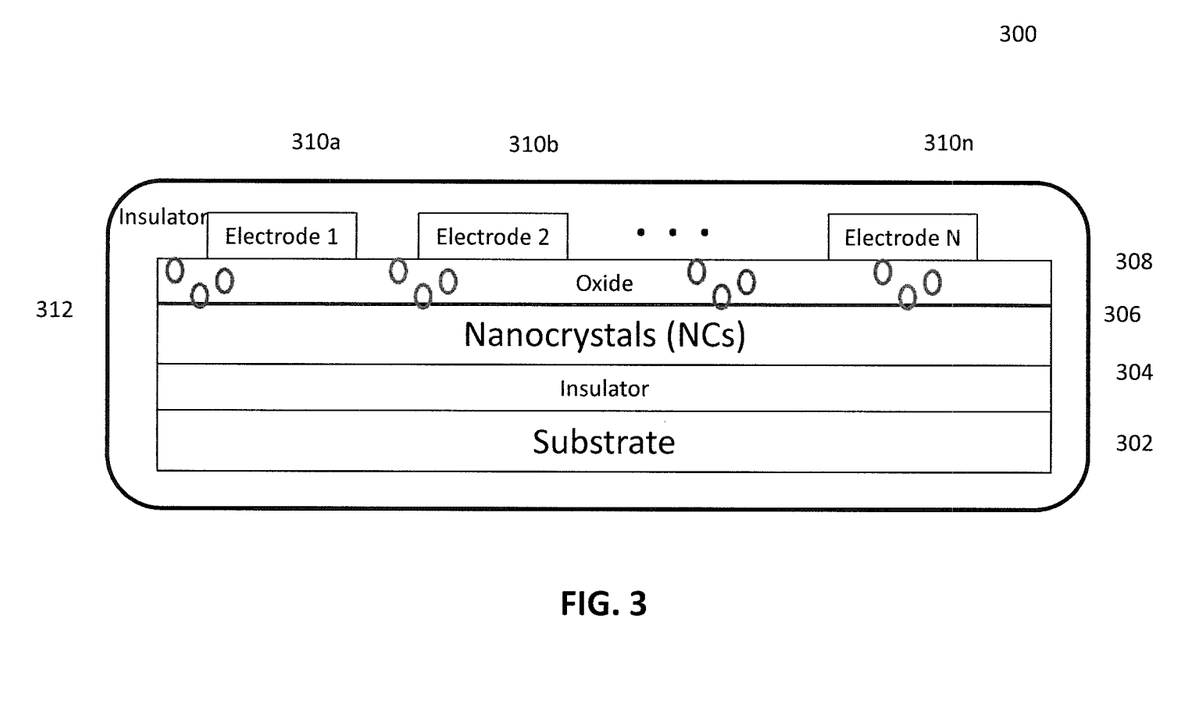
FIG. 3 is a block diagram of a nanocrystal thin film device in accordance with aspects of the present invention.

FIG. 3 depicts a nanocrystal thin film device 300. The device 300 includes a substrate 302. The substrate 302 may be a flexible or non-flexible material and may be a conductor, semi-conductor, or insulator. In one embodiment, the substrate 302 may is be n+ doped Silicon (Si), which behaves as a metal. An optional insulator layer 304 (e.g., an oxide such as Al2O3 or a polymer such as parylene) may be positioned over the substrate 302.

Nanocrystals 306 are positioned over the substrate 302 and optional oxide layer. The nanocrystals 306 are diffused with a dopant such as In that modifies the electrical properties of the nanocrystal thin film device 300. The electrical properties may be adversely affected by exposure to air, solvents, water, and/or O2. As described in detail below, the In diffusion into the nanocrystals enables restoration of the electrical properties after exposure to air, solvents, water, and/or O2. The nanocrystals may optionally be patterned, e.g., as described above with reference to FIG. 2, depending on the type of device being formed. An optional porous oxide layer 308 (such as Al2O3) is positioned over the nanocrystals 306. The circles in layer 308 are included to indicate that layer 308 is porous. The optional porous oxide layer may be used when photolithography is used to pattern a subsequent layer (e.g., an electrode layer) over the nanocrystals 306.

Electrodes 310 are positioned above the nanocrystals 306 and optional porous oxide layer 308. Because oxide layer 308 is porous, electrodes 310 are electrically coupled to nanocrystals 306.

In the case of an insulator substrate 302 (such as glass or plastic), to fabricate a FET, a bottom metal gate electrode may be deposited on the substrate 302 before the oxide 304 is deposited.

An encapsulating layer 312 is formed around at least a portion of the nanocrystal thin film device 300. The encapsulating layer 312 may be an insulator such as an oxide (e.g., Al2O3), a fluoride, a polymer (e.g. parylene) or combination of materials. Most nanocrystal devices, for example, electronics and optoelectronics, are fabricated in an ambient nitrogen environment provided by glove boxes. The inventors have discovered that exposure of nanocrystals (such as CdSe nanocrystal solids) to air and solvents (acetone, chloroform, alcohol, water) does not irreparably damage their electronic properties. Surface passivation is realized through the diffusion of a dopant such as In, Potassium, or Tin, which reduces surface states in nanocrystal solids that form upon air or various solvent exposure. Using a combination of electrochemical, optical, and electrical measurements the formation and impact of defect states upon air and solvent exposure and the recovery realized by annealing in the presence of In were analyzed.

Figure 4A:
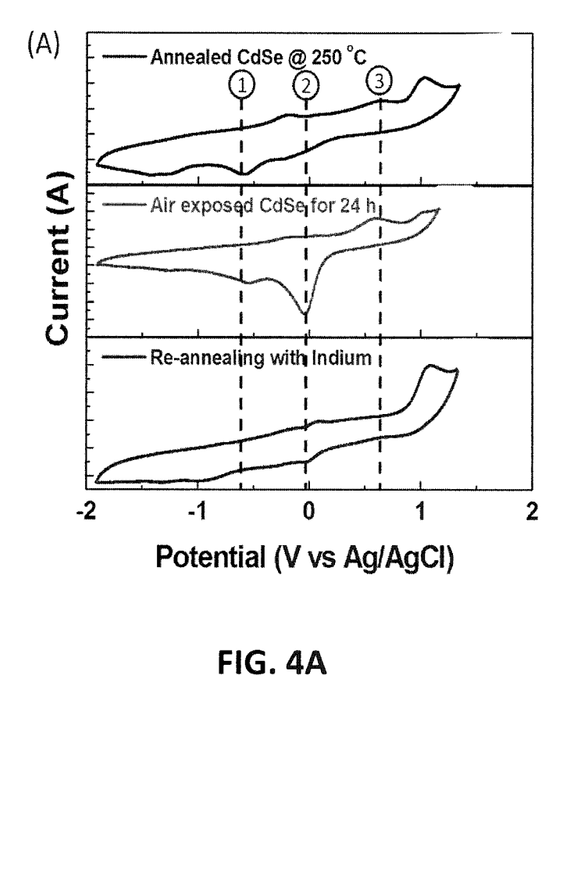
FIG. 4A is a series of graphs depicting cyclic voltammetry of nanocrystal thin films in accordance with aspects of the present invention.

FIG. 4A depicts a graph of cyclic voltammograms of nanocrystal solids: (top third) is annealed at 250° C., as used in FETs, (middle third) exposed to ambient air for 24 hours, and (bottom third) and after re-annealing in the presence of In. Defect states indexed to (1) Se divalent vacancies, (2) oxygen, (3) Se/Cd divacancies are illustrated. (1) and (3) are consistent with surface states passivated by In. A new peak (2) arises upon air exposure consistent with oxygen defect states as has been reported in bulk and thin film CdSe. Upon re-annealing the NC solid in the presence of indium, the peak associated with oxidation is seen to be nearly completely eliminated.

Figure 4B:
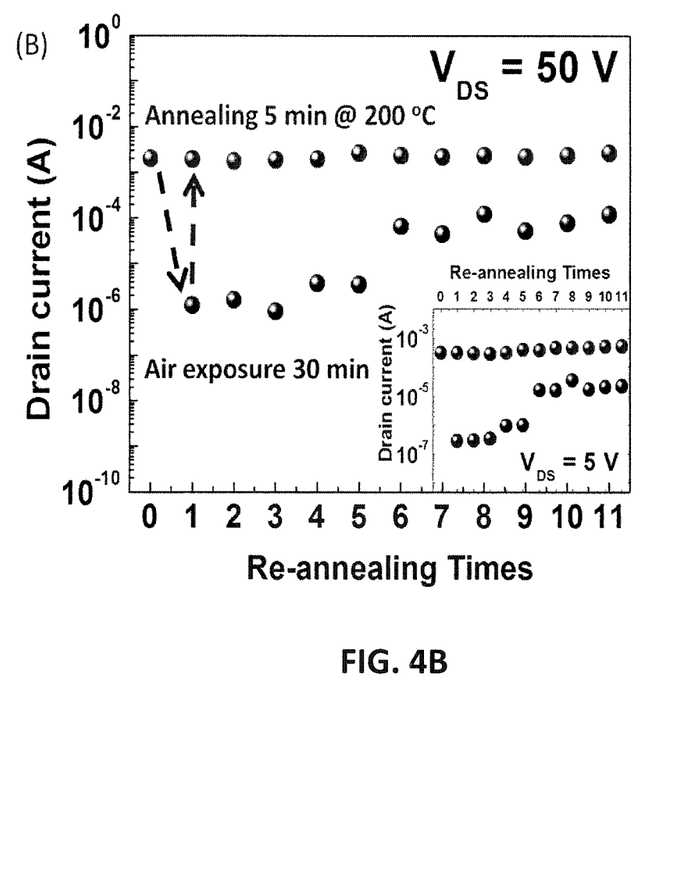
FIG. 4B is a graph depicting drain current in the saturation regime and an insert graph depicting drain current in the linear regime of a nanocrystal thin film Field Effect Transistor (FET) in accordance with aspects of the present invention.

FIG. 4B depicts a graph of nanocrystal FET drain current in the saturation regime, and (inset) in the linear regime, as pre-prepared (top substantially horizontal row of dots), upon air exposure (bottom series of dots), and successive re-annealing (top substantially horizontal row of dots) and air-exposure (bottom series of dots). The FETs have high drain currents (top substantially horizontal row of dots), which upon air exposure are dramatically reduced (bottom series of dots). Re-annealing these devices restores the electrical properties (top substantially horizontal row of dots). The impact of air exposure and the recovery of device electrical properties can be repeatedly cycled many times on multiple devices and over multiples wafers.

Figure 5A:
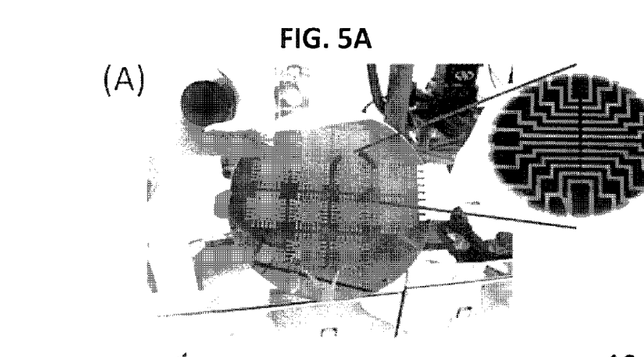
FIG. 5A is an image of a photograph depicting an encapsulated array of nanoscale thin film devices in accordance with aspects of the present invention.
Figure 5B:
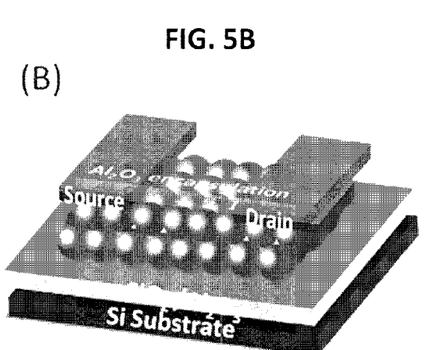
FIG. 5B is a perspective block diagram of an encapsulated nanocrystal thin film device configured as a FET in accordance with aspects of the present invention.
Figure 5C:
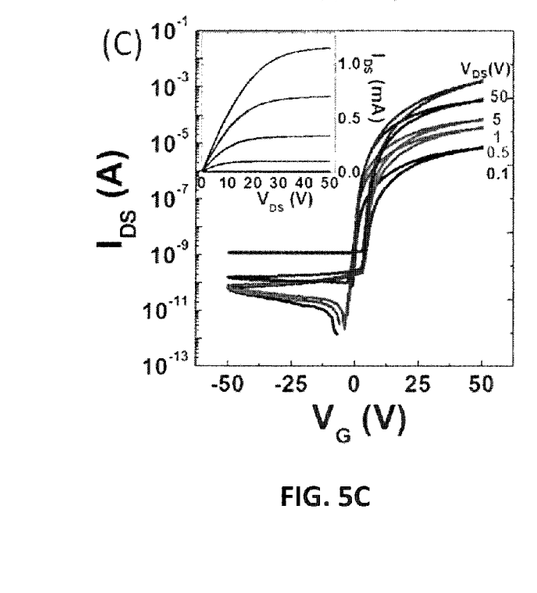
FIG. 5C is a graph depicting transfer characteristics of a nanocrystal thin film FET in accordance with aspects of the present invention.
Figure 5D:
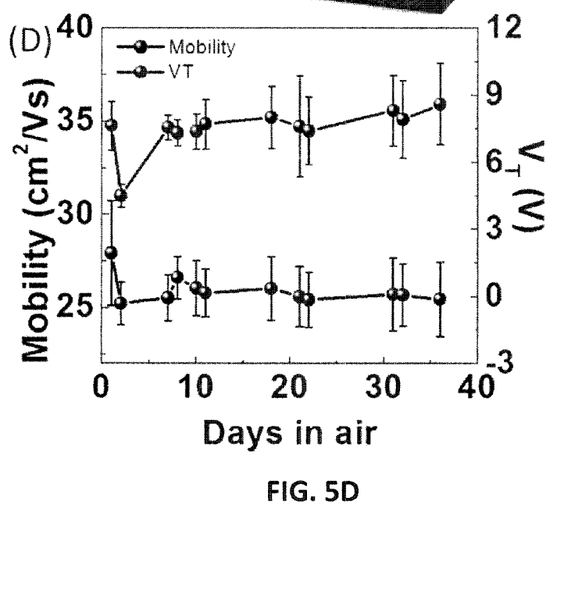
FIG. 5D is a graph depicting mobility and threshold voltage of nanocrystal thin film FETs in accordance with aspects of the present invention.

FIG. 5A is an image of photograph of an atomic layer deposition (ALD) Al2O3 encapsulated CdSe nanocrystal FETs. Photolithography is used to pattern source and drain electrodes on a uniform, spin-coated CdSe nanocrystal thin film solid (as highlighted in the upper left inset; without the source and drain electrodes) on an Al2O3 ALD coated, thermally oxidized (250 nm), 4" n+ Si wafer. FIG. 5B is a schematic highlighting the nanocrystal FET device structure and encapsulation layer. FIG. 5C is a graph of drain current (ID)-gate voltage (VG) (transfer) characteristics as a function of drain-source voltage (VDS) and (inset) ID-VDS (output) characteristics of a representative CdSe NC FET. FIG. 5D depicts mobility and threshold voltage operating in ambient air over a 5 week period.

Aspects of the present invention enable the introduction of solution processable materials into electronics that are stable in air, solvents, water, and/or O2, both during fabrication and operation. The use of In electrodes enable recovery of the electrical characteristics—providing air (as well as solvent) stability. The ability to process nanocrystal devices in ambient air enables use of additional fabrication technologies described herein.

In one embodiment, the electrodes are formed (block 112) by photolithographically patterning device contacts on top of the nanocrystals (e.g., on a CdSe nanocrystal channel layer). Photolithographic patterning enables reduction of the device overlap capacitance and enables scaling down of device size. Substrates of CdSe nanocrystal thin film solids were initially heated in a glovebox at 200° C. for five minutes and then placed in the atomic layer deposition (ALD) chamber to coat a 10 Å thin, permeable aluminum oxide uniformly over the film at 150° C. Heating at 200° C. decomposes the thiocyanate ligand, making the CdSe nanocrystal layer significantly less soluble to the solvents used in the photolithography process, while the thin ALD layer acts as a porous net to further prevent the CdSe nanocrystal film from delaminating (e.g., from the use of tetramethylammonium hydroxide (TMAH), which is used as a developer).

This porous film also allows the source-drain electrodes to still make effective contact with the CdSe NC thin film.

Standard photolithography techniques were employed outside of the glovebox to pattern source and drain electrodes on the CdSe nanocrystal film (heated at 200° C. and with a 10 Å thin oxide), followed by thermal deposition of In and Au for the electrodes. Lift-off may be done outside the glovebox, followed by a gentle annealing for 10 minutes at 250° C. inside the glovebox to facilitate doping with In (even through the porous ALD oxide layer). As described above, the annealing may be performed simultaneously with an encapsulating process (e.g., ALD process). FIG. 5A depicts an image of a photograph of an array of 144 CdSe nanocrystal FETs photolithographically patterned across a 4" Si wafer and the inset in FIG. 5A highlights the spin-coated nanocrystal film uniformity and the photolithographically patterned electrodes. The nanocrystal FETs form top-contact, back-gated FETs, employing the n+ Si wafer as the gate and an Al2O3/SiO2 stack as the gate dielectric layer, as shown in FIG. 5B. The lithographically fabricated devices have 100% yield and exhibit an average mobility of 27 cm2V-1s-1. This process may be extended to 4" square flexible substrates bearing photolithographically patterned Al gate lines with a thin ALD Al2O3 gate dielectric layer for low-voltage operation (see FIG. 6), as we have previously fabricated by defining the electrodes through shadow masks.

Figure 6:
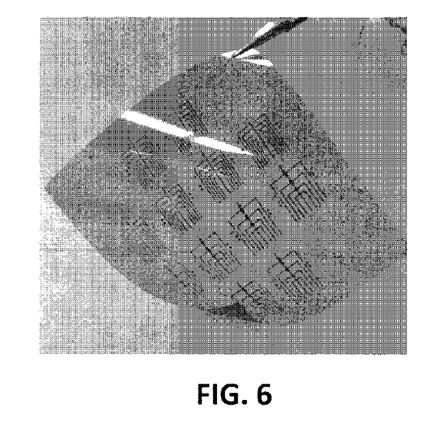
FIG. 6 is an image of a photograph of an array of nanocrystal thin film devices in accordance with an aspect of the present invention.

FIG. 6 depicts an image of a photograph of photolithographically patterned source and drain electrodes on a uniform, spin-coated CdSe NC thin film solid on Al2O3 ALD coated, photolithography patterned Al electrodes forming an array of back-gated FETs on a 4 inch square Kapton® substrate.

Transistors formed using the techniques described herein are highly uniform and deliver high-performance. Additionally, they are also compatible with ALD encapsulation, enabling these devices to operate in air. A thin, 50 nm, layer of ALD Al2O3 may be deposited uniformly across the 4" wafer to encapsulate the devices. The CdSe nanocrystal FETs form well behaved n-type devices in the linear and saturation regimes (see FIG. 5C). With the device encapsulated by the thin Al2O3 layer, the FETs were operated in air and the output and transfer characteristics were characterized over a period of 5 weeks. As depicted in FIG. 5D, the devices remained stable, maintaining high electron mobilities (left axis/lower data points) and stable threshold voltage (right axis/upper data points). The recovery and encapsulation processes enable use of a wide range of fabrication technologies, the realization of large-area, uniform NC devices, and is important to the exploration of their circuits.

Figure 8:
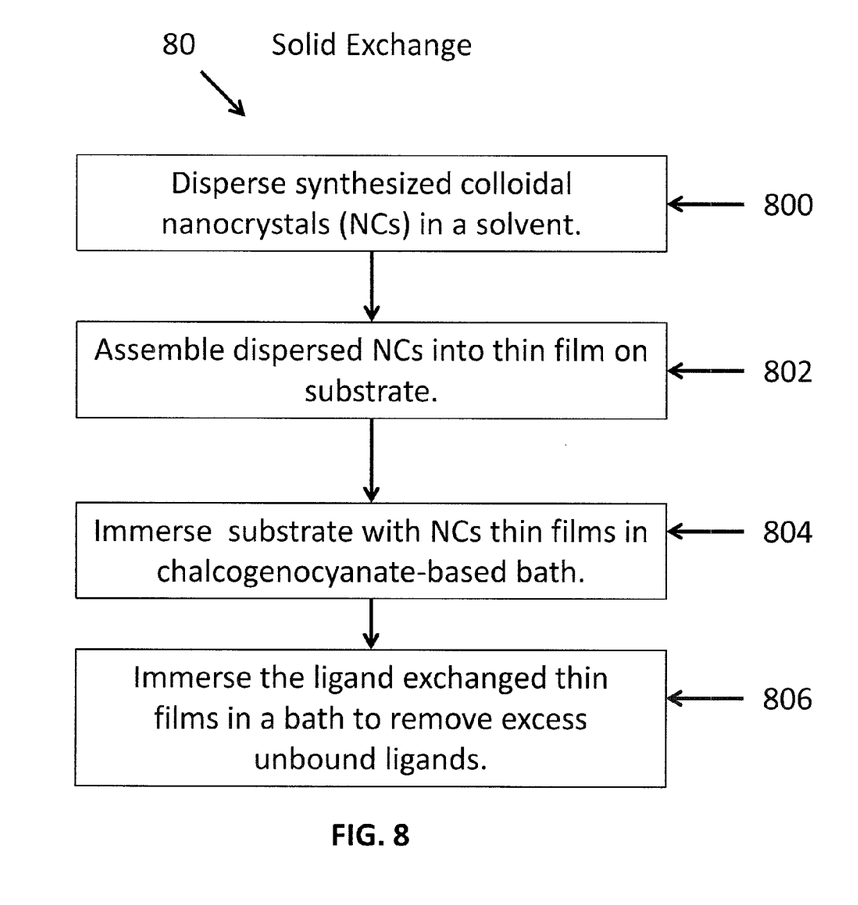
FIG. 8 is a flowchart depicting chalcogenocyanate-based ligand solid exchange in accordance with aspects of the present invention.

As described above, the re-annealing step at block 116 and the encapsulating step at block 118 may be performed as a single step. Generally, the devices demonstrate recovered, high-performance behavior upon re-annealing at about 200 C for about 5 minutes. Devices with an Al2O3/SiO2 gate dielectric stack demonstrate recovery upon re-annealing at about 175 C for about 5 minutes. At temperatures lower than about 150 C, devices demonstrate recovery by increasing the annealing time to about 90 minutes. Depending on the composition of the dielectric layer, annealing times may be increased to desorb water absorbed at the surface of the device (e.g., about 6 hours for devices with a SiO2 dielectric layer). Conventional ALD processes used for encapsulation of NC devices may be performed at temperatures similar in range to those for recovery (e.g., about 150 C for common ALD processes). This allows for the re-annealing/recovery and the encapsulating to be performed simultaneously (e.g., In diffusion during Al2O3 deposition), leading to fully passivated devices integrated in a single step. The temperatures, annealing times, and encapsulation processes described above are exemplary and not exclusive. Other suitable temperatures, anneal times, and encapsulation processes that may be used to achieve recovery and encapsulation in a single step will be understood by those of skill in the art from the description herein. FIG. 8 is a flowchart 80 of exemplary steps for exchanging ligands in a nanocrystal-based thin film with chalcogenocyanate (xCN)-based ligands. Such structures are useful for forming thin film electronics, optoelectronics, and/or photonics, for example. As used herein, the term "chalcogenocyanate-based" refers to materials or molecular compounds that include cyanate (OCN), thiocyanate (SCN), selenocyanate (SeCN), tellurocyanate (TeCN), quaterny ammonium salts (e.g., tetramethyl ammonium), etc. (e.g., NH4SCN, KSCN, NR4SCH where R is an alkyl group, etc.).

At block 800, synthesized nanocrystals are dispersed. The nanocrystals may be dispersed in a solvent (e.g., hexanes, octanes, etc.). The nanocrystals may be cadmium based (e.g., CdS, CdSe, CdTe, CdO), zinc based (e.g., ZnS, ZnSe, ZnTe), nickel or iron based (e.g., Ni, Fe, NiFe), gold based (e.g., AuAg, AuPt), silver based (Ag), bismuth based (e.g., Bi), and/or lead based (e.g., PbS, PbSe, PbTe). The nanocrystals may have various structures (e.g., cubical, spherical, core/shell, alloy, etc.) and various sizes. Other suitable dispersion solvents, nanocrystal compositions/alloys, and structures will be understood by one of skill in the art from the description herein. One or more of the steps of flowchart 80 may be performed in a is nitrogen atmosphere and/or in an air environment depending on the type of device being formed.

At block 802, the dispersed nanocrystals are assembled into one or more thin films. To assemble the one or more thin films, the nanocrystals may be deposited (e.g. drop-cast, spin-coat, dip-coat, printed, etc.) on a substrate and, if desired, repeated to form additional thin films. The substrate may be sapphire, glass, quartz, and/or polished silicon. In one embodiment, the substrate is flexible (e.g., polyimide, LDPE, PDMS). Other suitable substrates to assemble nanocrystals into thin film(s) will be understood by one of skill in the art. In embodiments where the substrate is glass or silicon, at least one silane layer may be assembled on the substrate to prevent delamination of nanocrystal film(s). The silane layer may be 3-mercaptopropyl-trimethoxysilane (MPTS) or other types of silane layers suitable for use to prevent delamination of the nanocrystal film(s). In one embodiment, after the nanocrystal film(s) are assembled, the film(s) are immersed in a solution to remove non-specifically bound ligands from the film(s). The solution may be a 2-propanol solution. In a particular embodiment, the film(s) are immersed in the 2-propanol solution for about 10 minutes.

At block 804, the ligands in the nanocrystal film(s) are exchanged with chalcogenocyanate-based ligands. The ligands may be exchanged by immersing the nanocrystal film(s) in a solution containing chalcogenocyanates, such as SCN, OCN, SeCN, TeCN, etc. The solution may contain ammonium-thiocyanate (NH4SCN) or potassium thiocyanate (KSCN). In a particular embodiment, the solution comprises between about 100 mM and about 250 mM of NH4SCN in acetone and the nanocrystal film(s) are immersed in the solution for about 1-2 minutes. In an exemplary embodiment, the solution comprises about 130 mM of NH4SCN in acetone.

At block 806, the nanocrystal film(s) with the exchanged chalcogenocyanate-based ligands are immersed in a bath to remove excess unbound ligands. The bath may be pure acetone. In one embodiment, the nanocrystal film(s) are immersed in the bath for about one minute. In another embodiment, the nanocrystal film(s) are immersed in successive baths.

Figure 9:
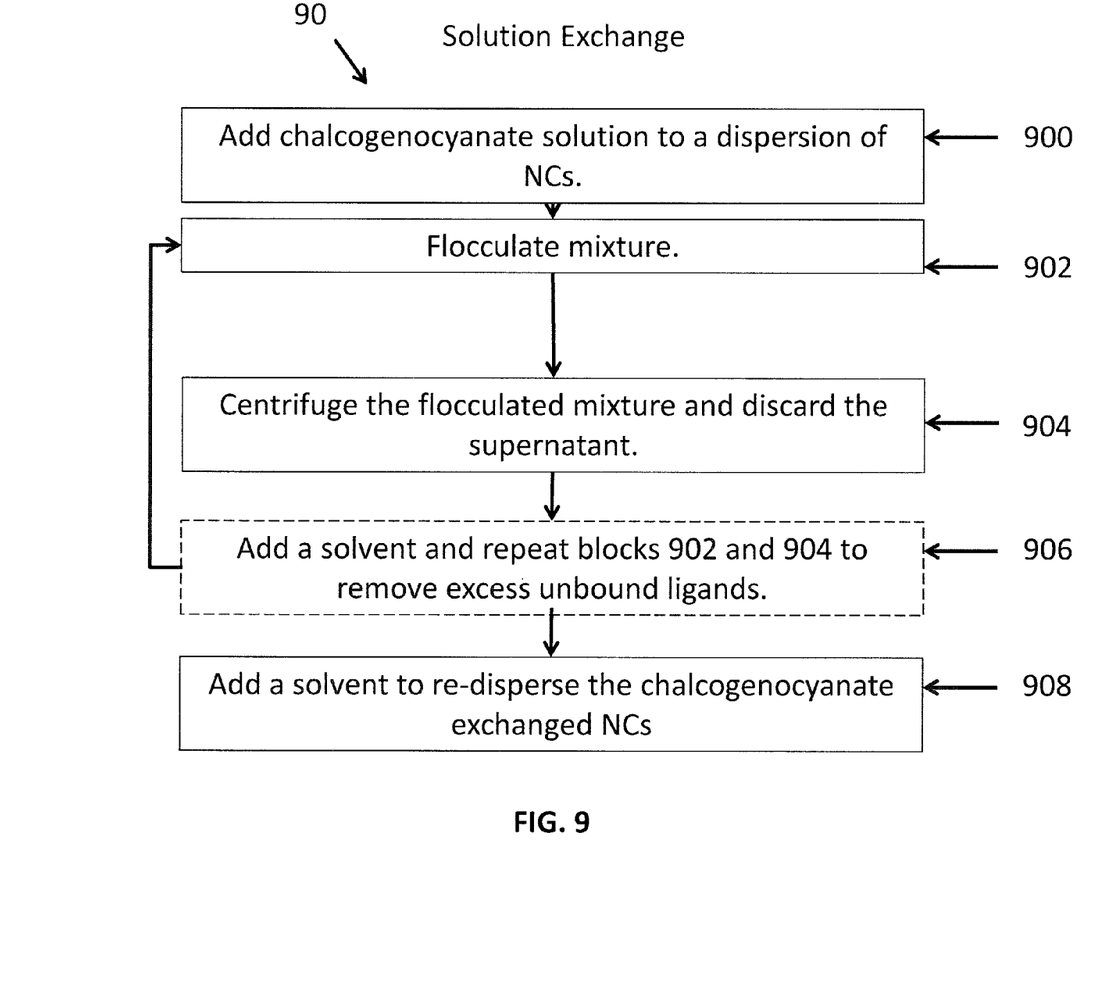
FIG. 9 is a flowchart depicting chalcogenocyanate-based ligand solution exchange in accordance with aspects of the present invention.

FIG. 9 is a flowchart 90 of exemplary steps for exchanging ligands in a synthesized nanocrystal solution to form a nanocrystal dispersed solution with exchanged ligands. Such solutions are useful, for example, as solutions to be formed into thin films for thin film based electronics, optoelectronics, and photonics. The nanocrystals may be cadmium based (e.g., CdS, CdSe, CdTe), zinc based (e.g., ZnS, ZnSe, ZnTe), nickel based (e.g., NiFe), gold based, silver based, bismuth based, lead based (e.g., PbS, PbSe, PbTe). Other suitable nanocrystal compositions, alloys and core/shells will be understood by one of skill in the art from the description herein. One or more of the steps of flowchart 90 may be performed in a nitrogen atmosphere and/or in an air environment depending on the type of device being formed.

At block 900, a chalcogenocyanate-based solution is added to a dispersion of synthesized nanocrystals. The synthesized nanocrystals may be dispersed in a solvent (e.g., hexanes, octanes, etc.). In one embodiment, the chalcogenocyanate-based solution contains between about 100 mM and about 250 mM of NH4SCN in acetone. In an exemplary embodiment, about 0.5 mL of 130 mM NH4SCN in acetone is added to about 1 mL dispersion of synthesized nanocrystals.

At block 902, the mixture of the chalcogenocyanate-based solution and the synthesized nanocrystals is flocculated. To achieve flocculation, the mixture may be agitated or stirred. In one embodiment, the mixture is agitated for about one minute. In an alternative embodiment, the mixture is stirred in a vortexing mixer. In an exemplary embodiment, the mixture is stirred in a vortexing mixer at about 3000 rpm for about 1-2 minutes. Other suitable techniques for achieving flocculation of the mixture will be understood by one of skill in the art from the description herein.

At block 904, the flocculated mixture is centrifuged until separation of a supernatant and a pellet, with the separated supernatant being discarded. The flocculated mixture may be centrifuged between about 2000×g and about 3000×g. In a particular embodiment, the flocculated mixture is centrifuged for about 1 minute.

At block 906, a solvent is added to the pellet to wash the pellet and the steps described in blocks 902 and 904 are repeated until a desired exchange of ligands has occurred. In an exemplary embodiment, the solvent is a non-dispersing solvent. Solvents that may be added include acetone, tetrahydrofuran, and/or toluene. Other suitable solvents will be understood by one of skill in the art. Flocculation of the resulting slurry may be achieved utilizing the flocculation at block 902. Separation of a supernatant and a pellet may be achieved utilizing the centrifuging at block 904. After separation of a supernatant and a pellet, the supernatant is discarded.

At block 908, the nanocrystals become substantially dispersed. Dispersion of the NCs may be achieved by adding a solvent to the pellet and agitating the mixture. In a particular embodiment, the added solvent is a dispersing solvent. The added solvent may be dimethyl sulfoxide (DMSO), dimethylformamide (DMF), n-methyl pyrollidinone (NMP) and/or dimethyl amide (DMA).

Figure 10A:
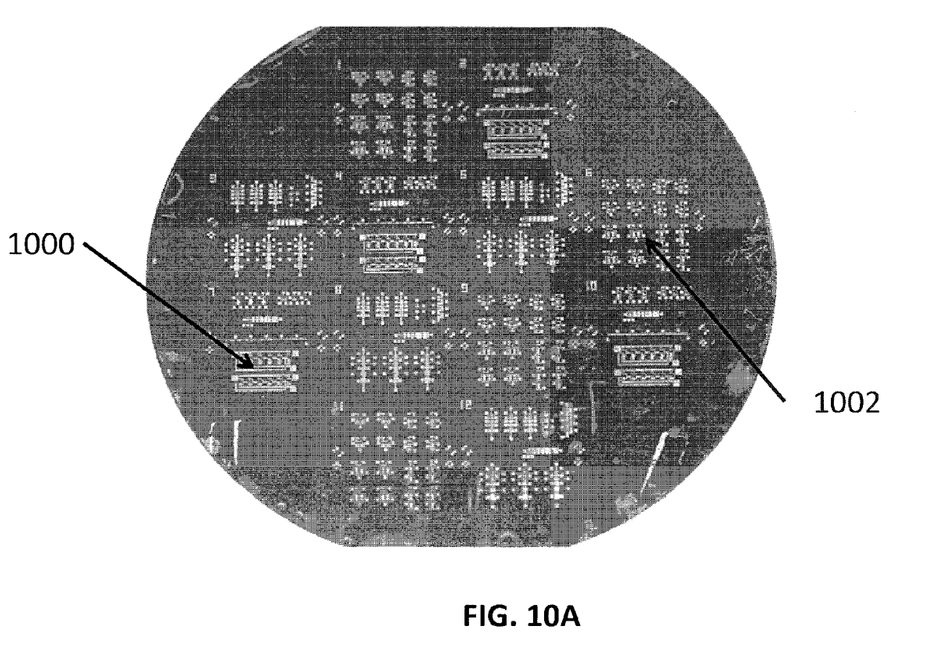
FIGS. 10A-10E depict various photolithographically patterned electrodes and photolithographically patterned nanocrystal layers according to aspects of the invention.
Figure 10B:
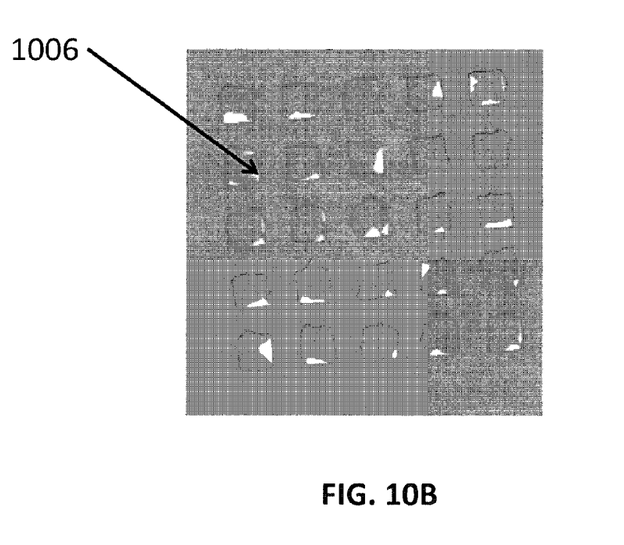
Figure 10C:
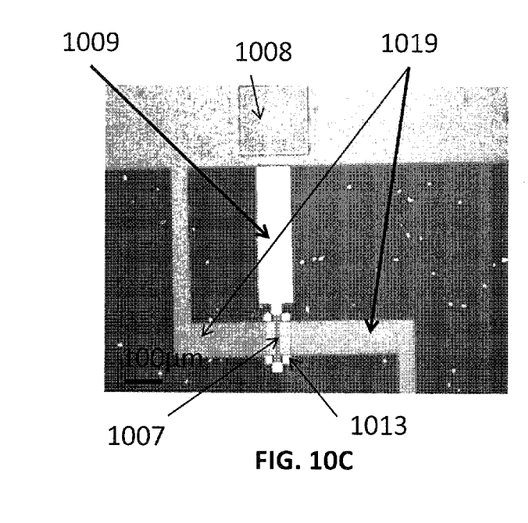
Figure 10D:
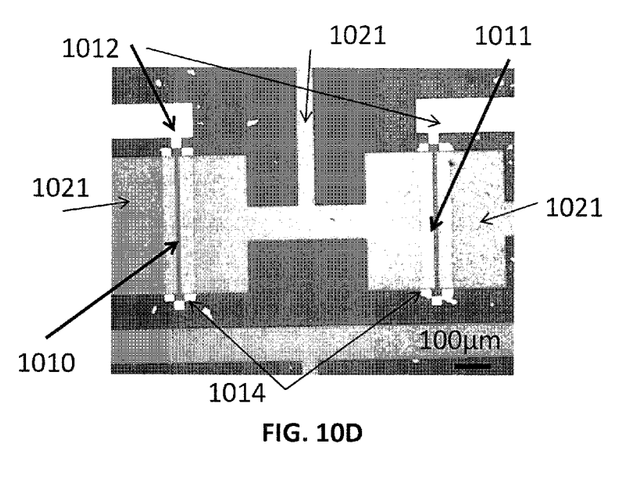

FIGS. 10A-10E depict various photolithographically patterned electrodes and photolithographically patterned nanocrystal layers enabled by the recovery processes and air processing techniques for the devices as described above. FIG. 10A depicts nanocrystal integrated circuits 1000 with photo-lithographically patterned electrodes and nanocrystal thin film FETs 1002 on a scale of 4 inch wafer. FIG. 10B depicts an optical micrograph of an array of patterned nanocrystal thin films 1006 with a gap of 25 micrometers and pitch of 50 micrometers. FIG. 10C depicts an optical micrograph of an active load realized by a nanocrystal thin film FET 1007 with vertical interconnect access 1008 and gate electrode/oxide layers 1009. FIG. 10D depicts an optical micrograph of a NOR logic gate comprising two integrated nanocrystal thin film FETs 1010 and 1011.

Figure 10E:
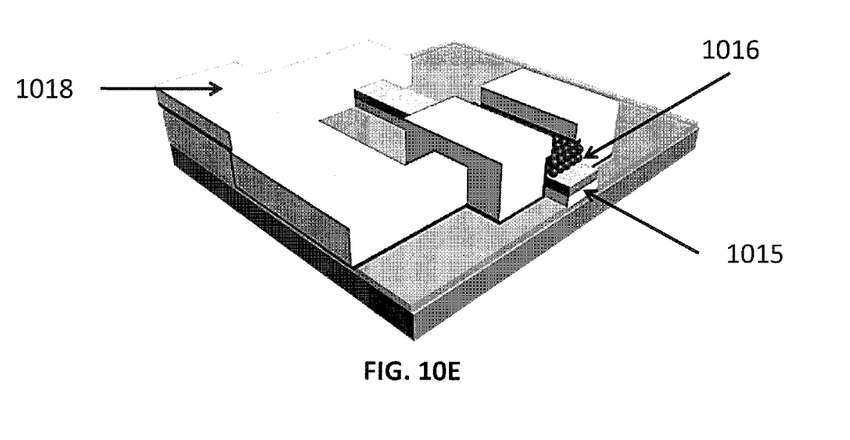

FIG. 10E is a perspective block diagram of an integrated photo-lithographically patterned nanocrystal thin film FET. Shown is a gate electrode and oxide 1015, which appears as 1007 in FIG. 10C and 1012 FIG. 10D. Spheres 1016 represent a patterned nanocrystal thin film, which appears as 1013 in FIG. 10C and 1014 in FIG. 10D. The blocks 1018 represent source/drain electrodes that appear as 1019 in FIG. 10C and 1021 in FIG. 10D.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of fabricating a nanocrystal thin film device that enables exposure to an air environment during a portion of the fabrication, the method comprising:
   assembling a nanocrystal layer on a substrate;
   depositing electrodes over the nanocrystal layer with a metal dopant present in the electrodes to form the nanocrystal thin film device;
   annealing the nanocrystal thin film device to diffuse the deposited metal dopant into the nanocrystal layer to reduce surface states of the nanocrystal layer;
   repeating the annealing to restore a portion of electrical properties of the nanocrystal thin film device; and
   encapsulating the nanocrystal thin film device;
   wherein the electrical properties of the nanocrystal thin film device diminish when expose to air.

2. The method of claim 1, further comprising: the encapsulating the nanocrystal thin film device in a layer of Aluminum Tri-Oxide (Al2O3).

3. The method of claim 2, wherein the annealing and encapsulating step are performed simultaneously.

4. The method of claim 1, further comprising: patterning the nanocrystal layer in an air environment.

5. The method of claim 1, wherein the metal dopant includes indium, potassium, or tin.

6. The method of claim 1, wherein the depositing of the electrodes comprises photolithographically depositing the electrodes and wherein the method further comprises: depositing a porous oxide layer over the nanocrystal layer prior to depositing the electrodes to prevent delamination of the nanocrystal layer.

* * * * *